United States Patent
Fan et al.

(10) Patent No.: US 9,374,099 B2
(45) Date of Patent: Jun. 21, 2016

(54) OSCILLATING SIGNAL GENERATOR, PHASE-LOCK LOOP CIRCUIT USING THE OSCILLATING SIGNAL GENERATOR AND CONTROL METHOD OF THE OSCILLATING SIGNAL GENERATOR

(71) Applicant: MEDIATEK INC., Hsin-Chu (TW)

(72) Inventors: Chi-Wei Fan, Hsinchu County (TW); Shiue-Shin Liu, HsinChu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 47 days.

(21) Appl. No.: 14/224,078

(22) Filed: Mar. 25, 2014

(65) Prior Publication Data

US 2015/0280723 A1 Oct. 1, 2015

(51) Int. Cl.
- *H03L 7/06* (2006.01)
- *H03L 7/099* (2006.01)
- *H03L 7/085* (2006.01)
- *H03L 7/10* (2006.01)

(52) U.S. Cl.
CPC ............... *H03L 7/099* (2013.01); *H03L 7/085* (2013.01); *H03L 7/10* (2013.01)

(58) Field of Classification Search
CPC ...................................................... H03L 7/099
See application file for complete search history.

(56) References Cited

U.S. PATENT DOCUMENTS

| | | | |
|---|---|---|---|
| 6,285,640 B1 | 9/2001 | Hayashi | |
| 6,496,470 B2 | 12/2002 | Hayashi | |
| 6,680,632 B1 | 1/2004 | Meyers | |
| 7,250,890 B1 * | 7/2007 | Wong | 341/154 |
| 8,085,098 B2 * | 12/2011 | Yamazaki | 331/10 |
| 8,421,542 B2 * | 4/2013 | Romano et al. | 331/17 |
| 8,620,436 B2 * | 12/2013 | Parramon et al. | 607/46 |
| 2003/0222722 A1 * | 12/2003 | Kwon | 331/17 |
| 2008/0129402 A1 * | 6/2008 | Han et al. | 331/179 |
| 2013/0222026 A1 * | 8/2013 | Havens | 327/158 |

OTHER PUBLICATIONS

Yoshiaki Konno et al., A CMOS 1X-to 16X-Speed DVD Write Channel IC, p. 568, 569, 618, ISSCC 2005 / Session 31 / Mass Storage / 31.1, 2005 IEEE international Solid-State Circuits Conference, Feb. 9, 2005.

* cited by examiner

*Primary Examiner* — Ryan Jager
(74) *Attorney, Agent, or Firm* — Winston Hsu; Scott Margo

(57) ABSTRACT

An oscillating signal generator includes: a controllable oscillator arranged to output an oscillating signal according to a control signal and a band adjusting signal; a control circuit arranged to generate a continuous signal having a specific slew-rate when the control signal reaches a boundary of a control signal interval; and a current mirror arranged to generate the band adjusting signal according to at least the continuous signal.

24 Claims, 10 Drawing Sheets

US 9,374,099 B2

OSCILLATING SIGNAL GENERATOR, PHASE-LOCK LOOP CIRCUIT USING THE OSCILLATING SIGNAL GENERATOR AND CONTROL METHOD OF THE OSCILLATING SIGNAL GENERATOR

BACKGROUND

The present invention relates to an oscillating signal generator, a phase-lock loop circuit using the oscillating signal generator and a control method of the oscillating signal generator, and more particularly to a phase-lock loop circuit having a low KVCO and a large tuning range, and the control method thereof.

In the field of phase-lock loop (PLL) circuit, a PLL circuit with a low KVCO (voltage-controlled oscillator (VCO) gain) has several benefits. For example, the first advantage is the jitter induced from the noise of the tuning signal of the VCO can be minimized. The second advantage is the PLL circuit has smaller chip size because the size of the loop filter capacitor is saved for a given bandwidth. However, the major problem associated with low KVCO PLL circuit is the small frequency adjusting range. This situation is even worse in advanced technology where low voltage is employed.

In addition, for the PLL circuit that needs wide continuous frequency sweeping range, the above problem is even worse. For example, in the CAV (Constant Angular Velocity) write case for a DVD system, the disc is rotated in constant angular velocity while the linear velocity will be proportional to radius position of PUH (Pick up head). The write clock frequency will be needed to "continuously sweep" from PUH in its inner position to outer position. The ratio for maximum and minimum frequency will be around 2.5×. For PLL circuit to cover such a wide range, the KVCO must be large. However, the conventional method used to lower the KVCO can only solve the problem arise from the process variation. Therefore, providing a PLL circuit with a low KVCO but larger tuning range is an urgent problem in this field.

SUMMARY

One of the objections of the present embodiment is to provide a phase-lock loop circuit having a low KVCO and a large tuning range.

According to a first embodiment of the present invention, an oscillating signal generator is disclosed. The oscillating signal generator comprises a controllable oscillator, a control circuit, and a current mirror. The controllable oscillator is arranged to output an oscillating signal according to a control signal and a band adjusting signal. The control circuit is arranged to generate a continuous signal having a specific slew-rate when the control signal reaches a boundary of a control signal interval. The current mirror is arranged to generate the band adjusting signal according to at least the continuous signal.

According to a second embodiment of the present invention, a phase-lock loop circuit is disclosed. The phase-lock loop circuit comprises a phase detector, a low-pass filter, a controllable oscillator, a control circuit, and a current mirror. The phase detector is arranged to generate a detection signal according to a reference signal and a feedback signal. The low-pass filter is arranged to generating a control signal according to the detection signal. The controllable oscillator is arranged to output an oscillating signal according to the control signal and a band adjusting signal. The control circuit is arranged to generate a continuous signal having a specific slew-rate when the control signal reaches a boundary of a control signal interval. The current mirror is arranged to generate the band adjusting signal according to at least the continuous signal. The feedback circuit is arranged to generate the feedback signal according to the oscillating signal.

According to a third embodiment of the present invention, a control method for controlling a controllable oscillator is disclosed. The control method comprises the steps: using a controllable oscillator to output an oscillating signal according to a control signal and a band adjusting signal; generating a continuous signal having a specific slew-rate when the control signal reaches a boundary of a control signal interval; and generating the band adjusting signal according to at least the continuous signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
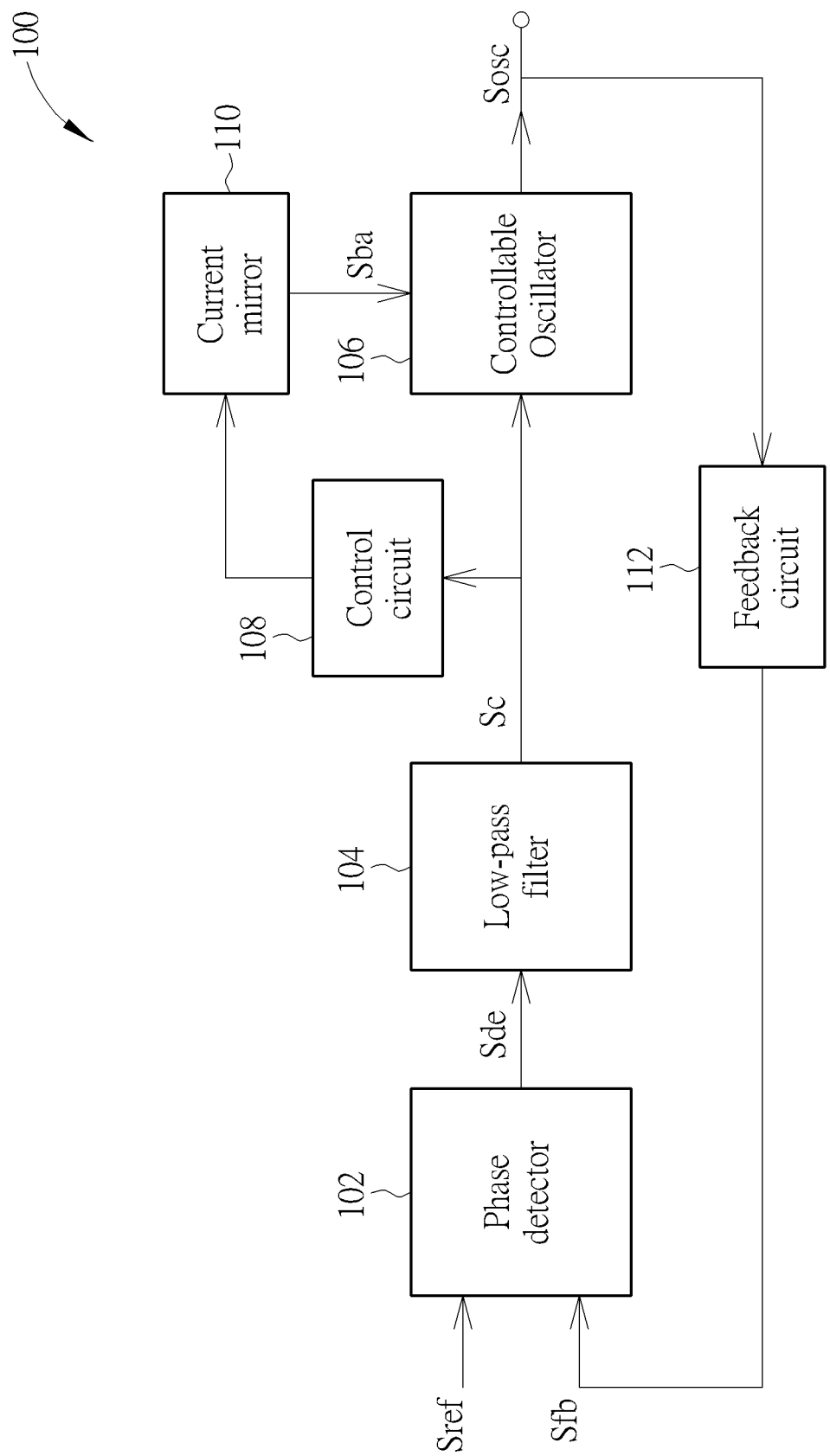
FIG. 1 is a diagram illustrating a phase-lock loop circuit according to an embodiment of the present invention.

Please refer to FIG. 1, which is a diagram illustrating a phase-lock loop (PLL) circuit 100 according to an embodiment of the present invention. The PLL circuit 100 comprises a phase detector 102, a low-pass filter 104, a controllable oscillator 106, a control circuit 108, a current mirror 110, and a feedback circuit 112. The phase detector 102 is arranged to generate a detection signal Sde according to a reference signal Sref and a feedback signal Sfb. The low-pass filter 104 is arranged to generating a control signal Sc according to the detection signal Sde. The controllable oscillator 106 is arranged to output an oscillating signal Sosc according to the control signal Sc and a band adjusting signal Sba. The control circuit 108 is arranged to generate a continuous signal Scs having a specific slew-rate when the control signal Sc reaches a boundary of a control signal interval. For example, the continuous signal Scs may be a ramp signal. The current mirror 110 is arranged to generate the band adjusting signal Sba according at least the continuous signal Scs. The feedback circuit 112 is arranged to generate the feedback signal Sfb according to the oscillating signal Sosc.

According to the embodiment in FIG. 1, the control circuit 108 in conjunction with the current mirror 110 are arranged to adjust the frequency band of the controllable oscillator 106 in real time according to the control signal Sc.

Figure 2:
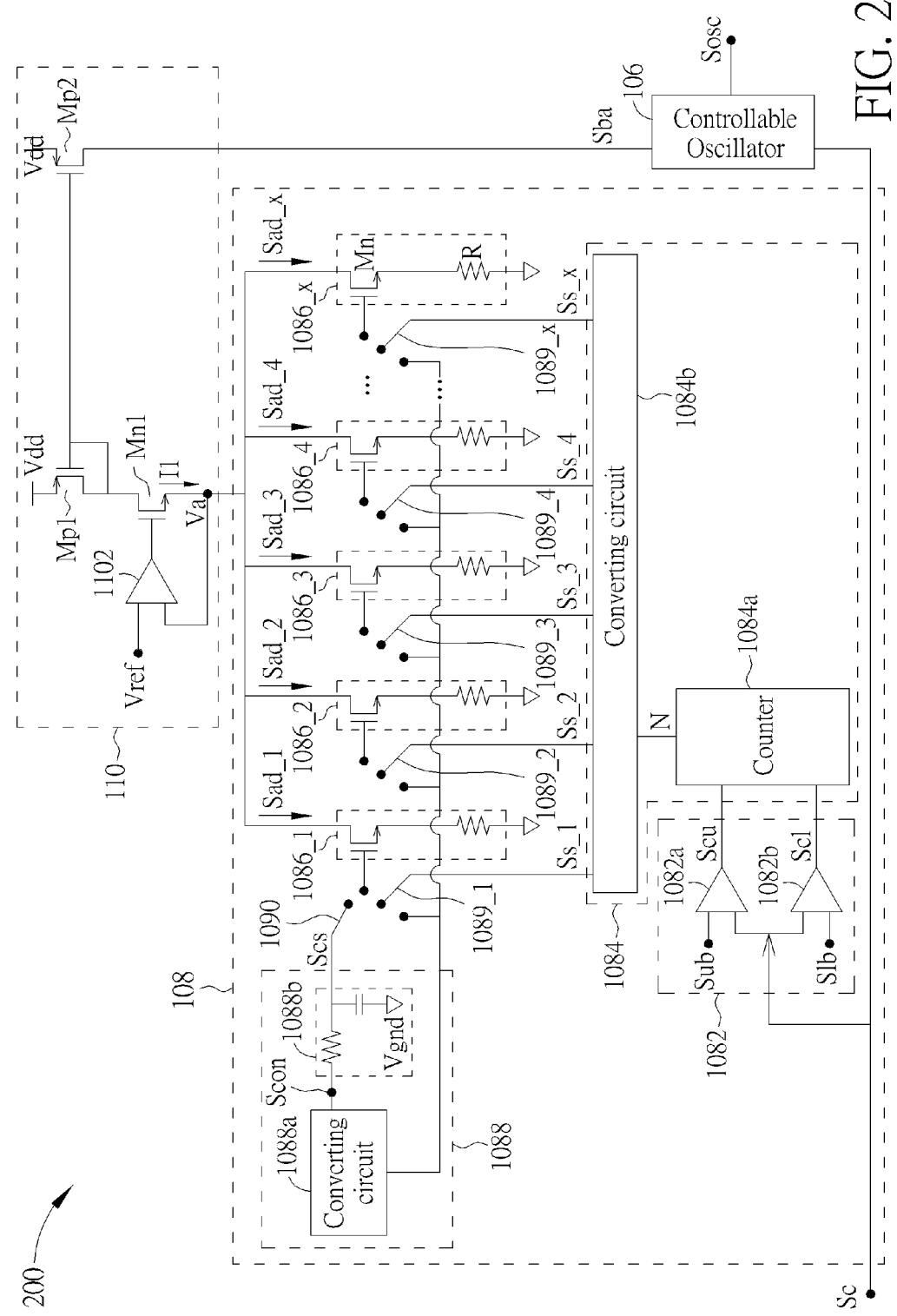
FIG. 2 is a diagram illustrating an oscillating signal generator according to an embodiment of the present invention.

To more clearly illustrate the feature of the PLL circuit 100, FIG. 2 shows the detailed components of the controllable oscillator 106, the control circuit 108, and the current mirror 110. FIG. 2 is a diagram illustrating the oscillating signal generator 200 according to an embodiment of the present invention. The oscillating signal generator 200 comprises the controllable oscillator 106, the control circuit 108, and the current mirror 110. The controllable oscillator 106 may be a current controlled oscillator. The controllable oscillator 106 may also be a voltage controlled oscillator.

The control circuit 108 comprises a detecting circuit 1082, a band selection circuit 1084, a plurality of band control cells 1086_1-1086_x, and a slew-rate limiting circuit 1088. The detecting circuit 1082 is arranged to detect when the control signal Sc reaches the boundary for generating a detection result. The band selection circuit 1084 is arranged to generate a plurality of selection signals Ss_1-Ss_x according to the detection result. The plurality of selection signals Ss_1-Ss_x may be a plurality of digital signals respectively. The plurality of band control cells 1086_1-1086_x are arranged to selectively provide a plurality of adjusting signals Sad_1-Sad_x according to the plurality of selection signals Ss_1-Ss_x respectively. The slew-rate limiting circuit 1088 is arranged to generate the continuous signal Scs to control a specific frequency band control cell of the plurality of band control cells 1086_1-1086_x to generate a specific adjusting signal of the plurality of adjusting signals Sad_1-Sad_x according to a specific selection signal of the plurality of selection signals Ss_1-Ss_x. Moreover, the current mirror 110 generates the band adjusting signal Sba according to the plurality of adjusting signals Sad_1-Sad_x including the specific adjusting signal.

The slew-rate limiting circuit 1088 comprises a converting circuit 1088a and a low-pass filter 1088b. The converting circuit 1088a is arranged to receive and convert the specific selection signal into a conversion signal Scon. The low-pass filter 1088b is arranged to performing a low-pass operation upon the conversion signal Scon to generate the continuous signal Scs for controlling the specific frequency band control cell.

In this embodiment, the slew-rate limiting circuit 1088 further comprises a plurality of switches 1089_1-1089_x and a selection switch 1090. Each switch is arranged to couple a selection signal in the plurality of selection signals Ss_1-Ss_x to a band control cell in the plurality of band control cells 1086_1-1086_x if a signal level of the selection signal is the first signal level (e.g. the high voltage level) before the control signal Sc reaches the boundary, and when the control signal Sc reaches the boundary, a specific switch in the plurality of switches 1089_1-1089_x is arranged to couple the specific selection signal to the converting circuit 1088a. The selection switch 1090 is coupled to the low-pass filter 1088b for coupling the continuous signal Scs to the specific frequency band control cell when the control signal Sc reaches the boundary.

The detecting circuit 1082 comprises a first comparator 1082a and a second comparator 1082b. The first comparator 1082a is arranged to compare the control signal Sc with an upper boundary Sub, and to output a first comparison signal Scu as the detection result when the control signal Sc reaches the upper boundary Sub. The second comparator 1082b is arranged to compare the control signal Sc with a lower boundary Slb, and to output a second comparison signal Scl as the detection result when the control signal Sc reaches the lower boundary Slb, wherein the control signal interval is the interval between the upper boundary Sub and the lower boundary Slb.

The band selection circuit 1084 comprises a counter 1084a and a converting circuit 1084b. The counter 1084a is arranged to generate a counting number N according to the first comparison signal Scu and the second comparison signal Scl. The converting circuit 1084b is arranged to convert the counting number N into the plurality of selection signals Ss_1-Ss_x, wherein the counting number N indicates a current frequency band being selected by the controllable oscillator 106.

According to this embodiment, the plurality of band control cells 1086_1-1086_x are a plurality of switching cells. Each of the band control cells 1086_1-1086_x comprises an N-type field-effect transistor Mn and a resistor R as shown in FIG. 2. The field-effect transistor Mn has a gate terminal selectively coupled to one of the plurality of selection signals Ss_1-Ss_x or the continuous signal Scs, a drain terminal selectively outputted one of the plurality of adjusting signals Sad_1-Sad_x. The resistor R has a first terminal coupled to a source terminal of the field-effect transistor Mn, and a second terminal coupled to a reference voltage, i.e. the ground voltage Vgnd.

Furthermore, the current mirror 110 comprises a comparator 1102, an N-type field-effect transistor Mn1, a P-type field-effect transistor Mp1, and a P-type field-effect transistor Mp2. The comparator 1102 is arranged to compare a reference voltage Vref with a first voltage Va as shown in FIG. 2. The comparison output of the comparator 1102 is inputted to the gate terminal of the N-type field-effect transistor Mn1. Therefore, the comparator 1102 and the N-type field-effect transistor Mn1 are configured as a negative feedback loop such that the first voltage Va is forced to be the reference voltage Vref. The P-type field-effect transistor Mp1 is diode-connected transistor having a source terminal coupled to a supply voltage Vdd. The P-type field-effect transistor Mp2 is arranged to mirror a current I1 passing through the P-type field-effect transistor Mp1 to generate an output current, i.e. the band adjusting signal Sba. The current I1 is the total current of the plurality of adjusting signals Sad_1-Sad_x. In other words, the plurality of adjusting signals Sad_1-Sad_x are a plurality of current signals controlled by the plurality of selection signals Ss_1-Ss_x respectively.

Accordingly, for each band control cell of the band control cells $1086\_1$-$1086\_x$, the current (i.e. the adjusting signal) generated by the band control cell is Vref/R when the N-type field-effect transistor Mn in the band control cell is fully turned on by the corresponding the selection signal. Therefore, the current I1 is the multiple of the Vref/R when the signal level of the control signal Sc in within the upper boundary Sub and the lower boundary Slb.

Figure 3:
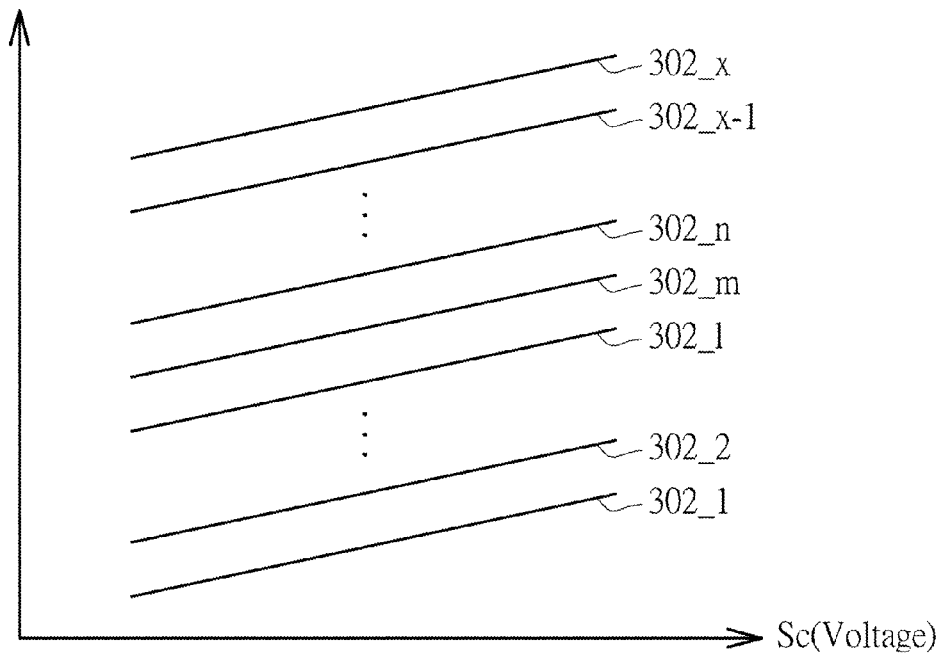
FIG. 3 is a diagram illustrating a plurality of frequency bands can be selected by a controllable oscillator according to an embodiment of the present invention.

Please refer to FIG. 3, which is a diagram illustrating a plurality of frequency bands $302\_1$-$302\_x$ can be selected by the controllable oscillator 106 according to an embodiment of the present invention. In FIG. 3, the X-axis represents the voltage level of the control signal Sc, and the Y-axis represents the frequency of the oscillating signal Sosc. Moreover, the plurality of frequency bands $302\_1$-$302\_x$ are represented by a plurality of parallel lines with nearly the same slope, which means that each band has nearly the same KVCO with the other bands. Therefore, the loop dynamics of the PLL circuit 100 will also be nearly the same between the different bands. More specifically, when the signal level of the control signal Sc is within the interval between the upper boundary Sub and the lower boundary Slb, and if the signal level of the first selection signal $Ss\_1$ is the high voltage level and the other of the first selection signals $Ss\_2$-$Ss\_x$ are the low voltage levels, which means that only the first band control cell $1086\_1$ is turned on, then the controllable oscillator 106 is operated under the first frequency band $302\_1$. Similarly, when the signal level of the control signal Sc is within the interval between the upper boundary Sub and the lower boundary Slb, and if the signal levels of the first selection signal $Ss\_1$ and the second selection signal $Ss\_2$ are the high voltage levels and the other of the first selection signals $Ss\_3$-$Ss\_x$ are the low voltage levels, which means that only the first and second band control cells $1086\_1$-$1086\_2$ are turned on, then the controllable oscillator 106 is operated under the second frequency band $302\_2$, and so on.

However, when the signal level of the control signal Sc reaches or crosses the upper boundary Sub or the lower boundary Slb, this means the frequency band currently used by the controllable oscillator 106 should be changed to an adjacent frequency band. For example, when the signal level of the control signal Sc reaches or crosses the upper boundary Sub, the frequency band (e.g. the frequency band $302\_m$) of the controllable oscillator 106 should be changed to an upper frequency band (e.g. the frequency band $302\_n$) adjacent to the current frequency band. When the signal level of the control signal Sc reaches the lower boundary Slb, the frequency band of the controllable oscillator 106 should be changed to a lower frequency band (e.g. the frequency band $302\_l$) adjacent to the current frequency band.

Figure 4:
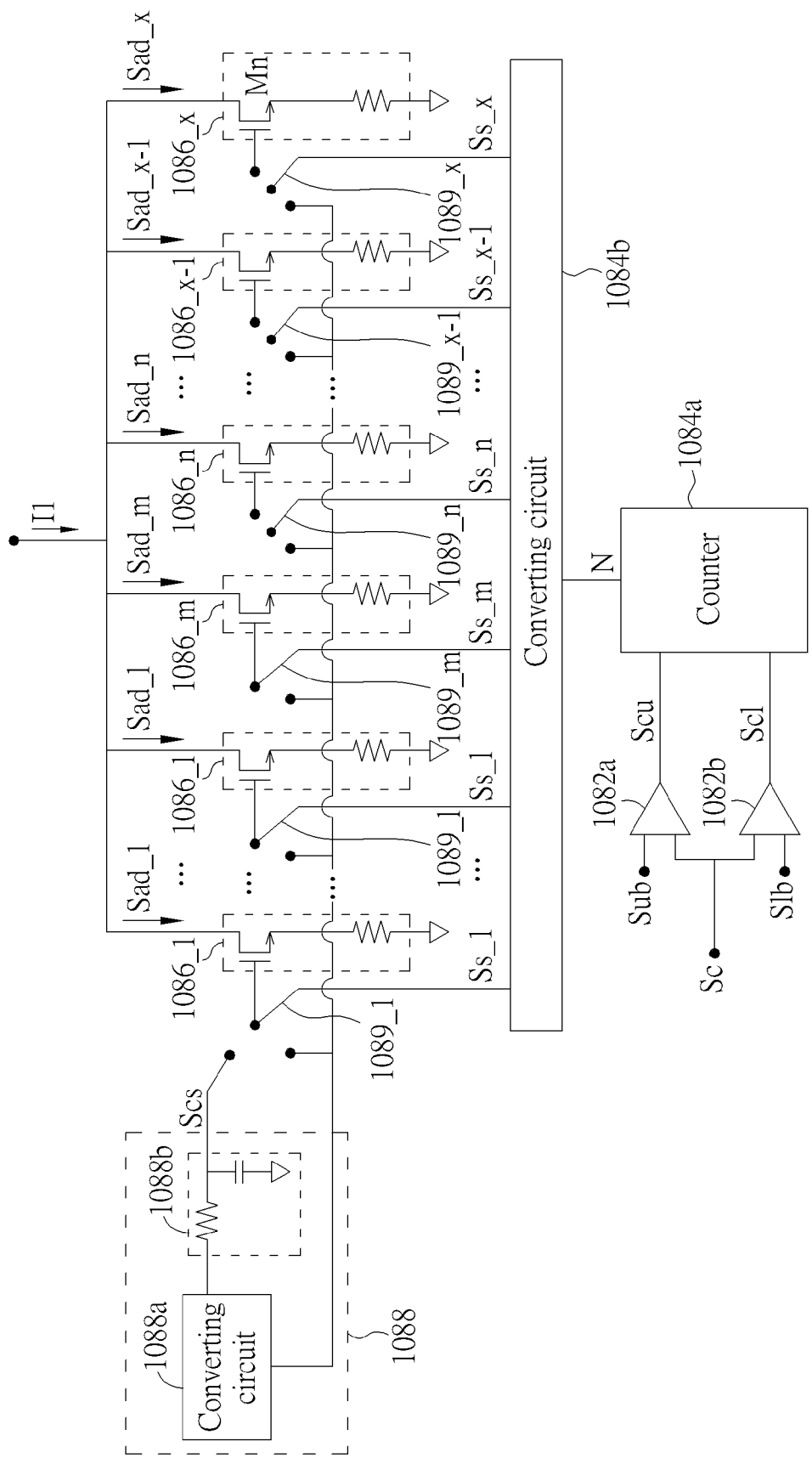
FIG. 4 is a diagram illustrating a partial circuit of an oscillating signal generator when a signal level of a control signal is within the interval between an upper boundary and a lower boundary according to an embodiment of the present invention.

More specifically, when the PLL circuit 100 is under operation and the current frequency band of the controllable oscillator 106 is the frequency band $302\_m$, and when the signal level of the control signal Sc reaches the upper boundary Sub, then the first comparator 1082a outputs the first comparison signal Scu to indicate that the signal level of the control signal Sc reaches the upper boundary Sub. The counter 1084a counts up the current counting number N by 1, and outputs the resulting counting number N+1 to the converting circuit 1084b. It should be noted that the counter 1084a counts down the current counting number N by 1, and outputs the resulting counting number N−1 to the converting circuit 1084b when the signal level of the control signal Sc reaches the lower boundary Slb. It is also should be noted that, before the signal level of the control signal Sc reaches the upper boundary Sub, the plurality of selection signals $Ss\_1$-$Ss\_m$ having the high voltage levels are connected to the plurality of band control cells $1086\_1$-$1086\_m$ respectively as shown in FIG. 4. FIG. 4 is a diagram illustrating a partial circuit of the oscillating signal generator 200 when the signal level of the control signal Sc is within the interval between the upper boundary Sub and the lower boundary Slb (i.e. before the signal level of the control signal Sc reaches the upper boundary Sub) according to an embodiment of the present invention. It can be seen that the plurality of switches $1089\_1$-$1089\_m$ are arranged to couple the plurality of selection signals $Ss\_1$-$Ss\_m$ to the plurality of band control cells $1086\_1$-$1086\_m$ respectively before the signal level of the control signal Sc reaches the upper boundary Sub.

Figure 5:
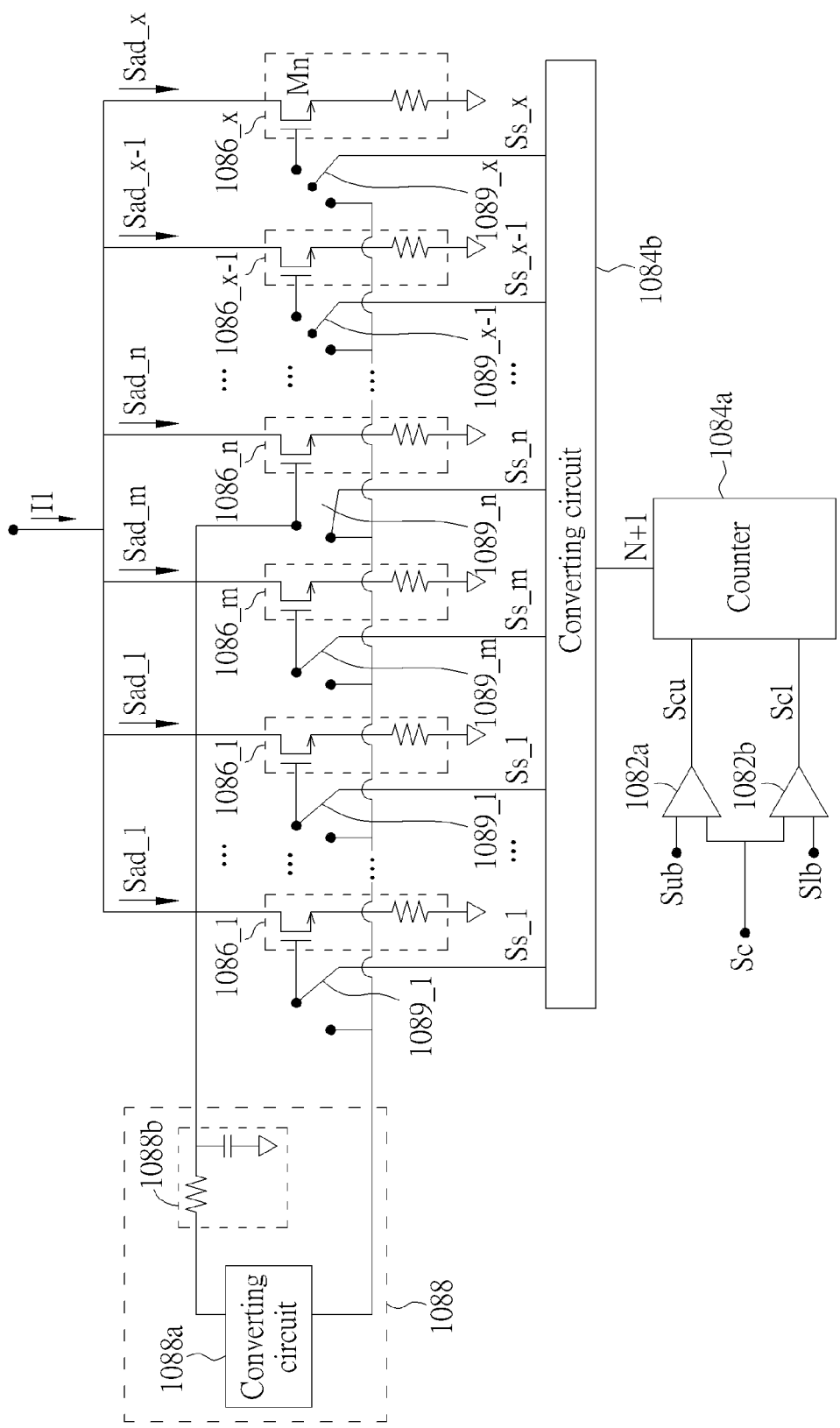
FIG. 5 is a diagram illustrating a partial circuit of an oscillating signal generator when a signal level of a control signal reaches an upper boundary according to an embodiment of the present invention.
Figure 6A:
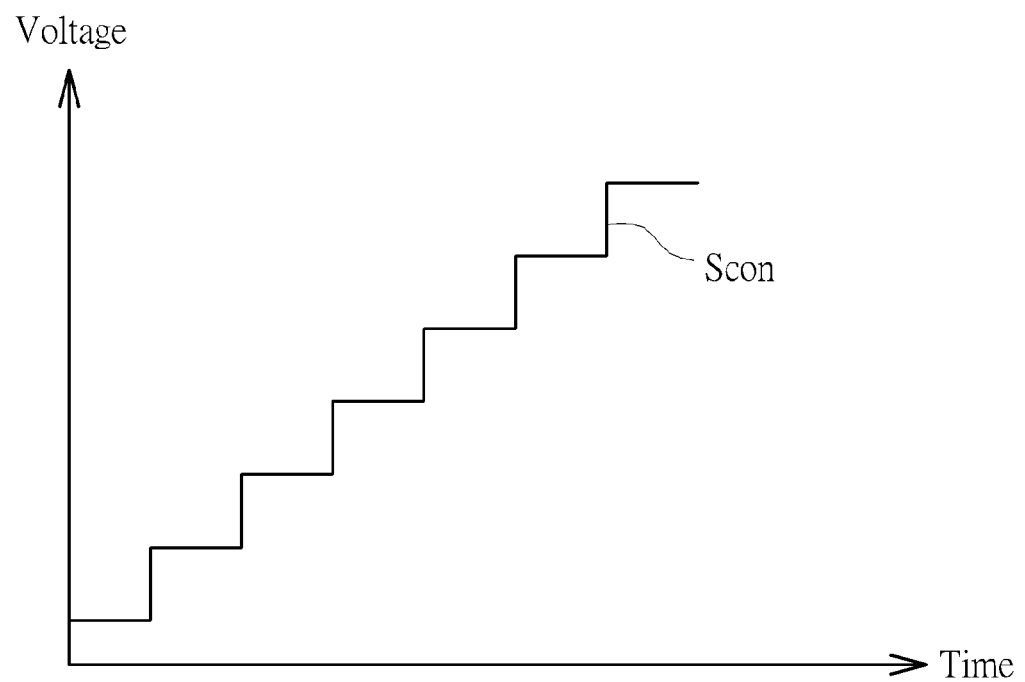
FIG. 6A and FIG. 6B are timing diagrams illustrating a conversion signal and a continuous signal according to an embodiment of the present invention respectively.
Figure 6B:
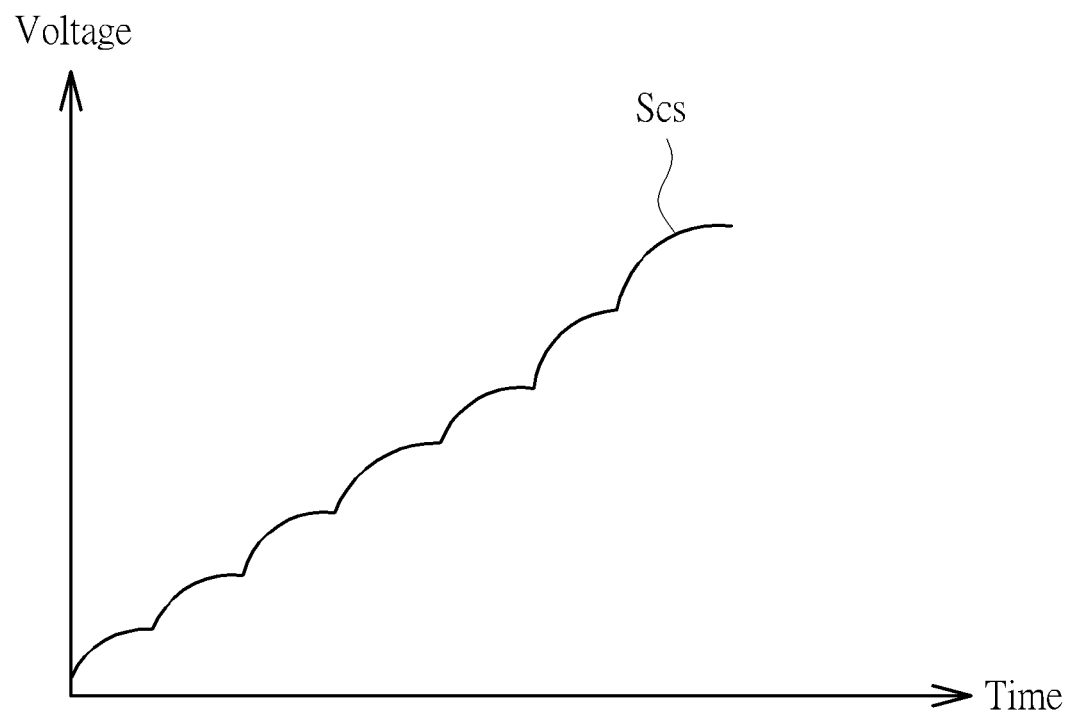

When the signal level of the control signal Sc reaches the upper boundary Sub, the selection signal $Ss\_n$ may change to the high voltage level from a second signal level (i.e. the low voltage level). Meanwhile, the switch $1089\_n$ is arranged to couple the selection signal $Ss\_n$ to the converting circuit 1088a and the selection switch 1090 is arranged to couple the continuous signal Scs to the band control cell $1086\_n$ (i.e. the above mentioned specific band control cell) as shown in FIG. 5. FIG. 5 is a diagram illustrating a partial circuit of the oscillating signal generator 200 when the signal level of the control signal Sc reaches the upper boundary Sub according to an embodiment of the present invention. In FIG. 5, the converting circuit 1088a is arranged to convert the selection signal $Ss\_n$ into the conversion signal Scon. The low-pass filter 1088b comprises a resistor and a capacitor, and the low-pass filter 1088b is arranged to performing the low-pass operation upon the conversion signal Scon to generate the continuous signal Scs for controlling the band control cell $1086\_n$. FIG. 6A and FIG. 6B are the timing diagrams illustrating the conversion signal Scon and the continuous signal Scs according to an embodiment of the present invention respectively. The converting circuit 1088a is a digital-to-analog converter. However, the conversion signal Scon is a stair signal that is not smooth enough to control the band control cell $1086\_n$. Therefore, the low-pass filter 1088b is arranged to perform the low-pass operation upon the conversion signal Scon to generate a smooth rising signal, i.e. the continuous signal Scs. Accordingly, when the continuous signal Scs is connected to the band control cell $1086\_n$, the continuous signal Scs is capable of smoothly or slowly turning on the N-type field-effect transistor Mn of the band control cell $1086\_n$. As a result, the current (i.e. the adjusting signal $Sad\_n$) of the band control cell $1086\_n$ is smoothly increased and injected to the controllable oscillator 106 such that the frequency band is changed to the frequency band 302n from the frequency band $302\_m$. It should be noted that when the continuous signal Scs is connected to the gate of the N-type field-effect transistor Mn of the band control cell $1086\_n$, the N-type field-effect transistor Mn is operated under the triode region, therefore the N-type field-effect transistor Mn is a voltage controlled resistor.

It should also be noted that as most signals inside the single chip (i.e. the PLL circuit 100) are of voltage type, there are much more voltage type noise (e.g. the noise of a clock signal) than current type noise inside the single chip. Therefore, one of the advantages of using the current-control oscillator (i.e. the controllable oscillator 106) is the current-control oscillator is less susceptible to the voltage type noise. However, this is not a limitation of the present invention, those skill in the art are appreciated that using the voltage-control oscillator to be the controllable oscillator 106 also belongs to the scope of the present invention.

Figure 7:
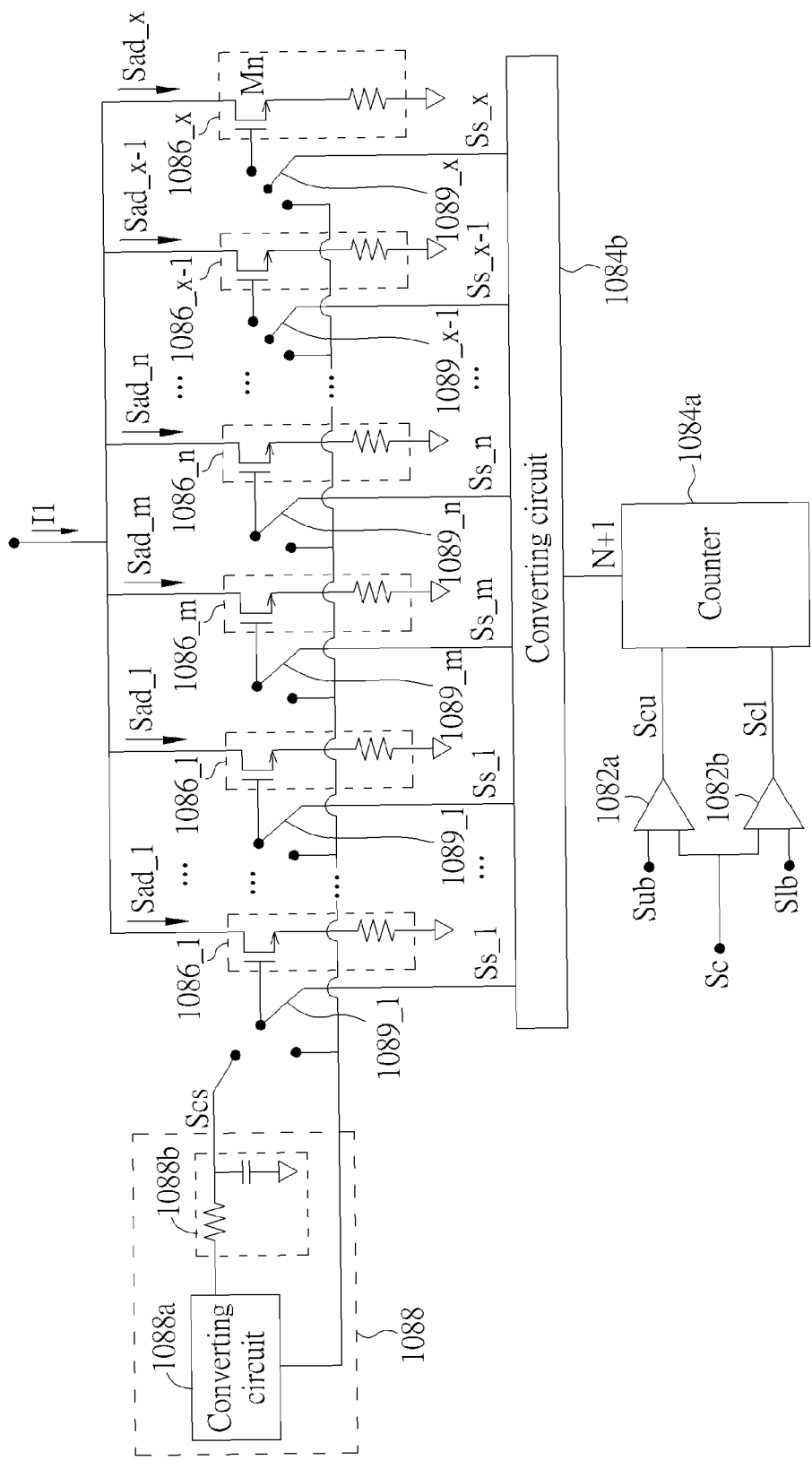
FIG. 7 is a diagram illustrating a partial circuit of an oscillating signal generator when a voltage level of a continuous signal reaches a high voltage level according to an embodiment of the present invention.

Moreover, when the voltage level of the continuous signal Scs reaches the high voltage level, the N-type field-effect transistor Mn of the band control cell $1086\_n$ is fully turned on. Then, the selection switch 1090 is arranged to disconnect the continuous signal Scs from the band control cell 1086_n meanwhile the switch 1089_n is arranged to couple the selection signal Ss_n to the band control cell 1086_n and to disconnect the selection signal Ss_n from the converting circuit 1088a as shown in FIG. 7. FIG. 7 is a diagram illustrating a partial circuit of the oscillating signal generator 200 when the voltage level of the continuous signal Scs reaches the high voltage level according to an embodiment of the present invention. It can be seen that the plurality of switches 1089_1-1089_n are arranged to couple the plurality of selection signals Ss_1-Ss_n to the plurality of band control cells 1086_1-1086_n respectively. Accordingly, the current frequency band of the controllable oscillator 106 is the frequency band 302n.

Figure 8:
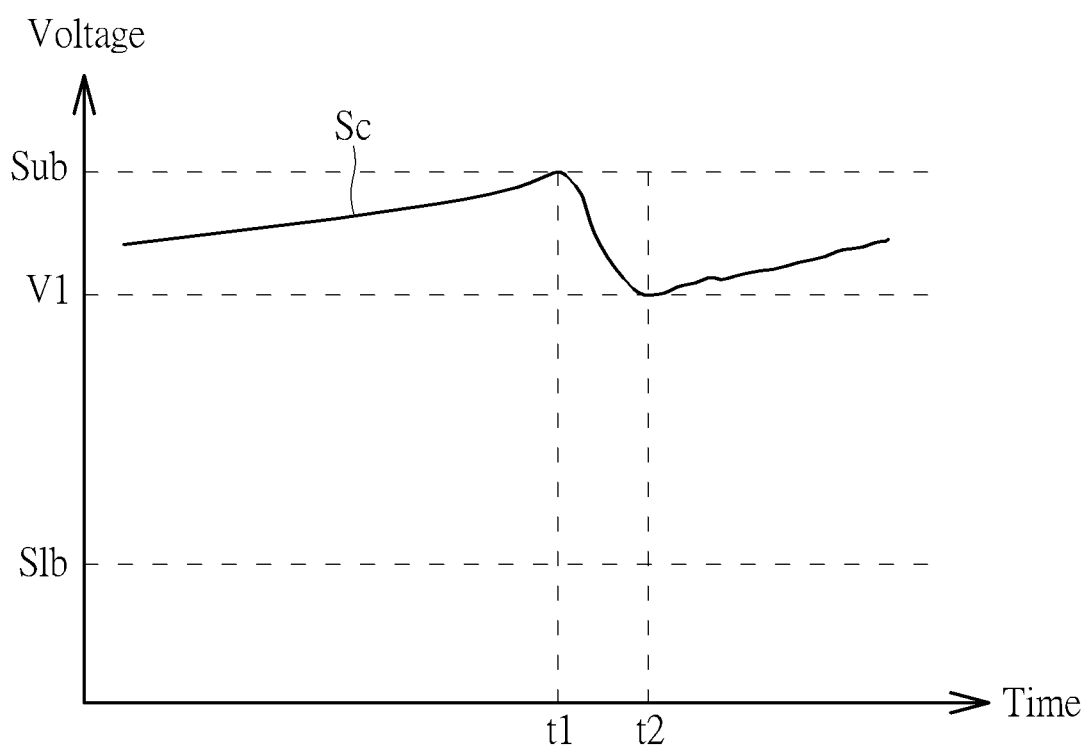
FIG. 8 is a timing diagram illustrating a control signal when a frequency band of an oscillating signal generator is changed into a frequency band according to an embodiment of the present invention.

Please refer to FIG. 8, which is a timing diagram illustrating the control signal Sc when the frequency band of the oscillating signal generator 200 is changed into the frequency band 302n from the frequency band 302_m according to an embodiment of the present invention. At time t1, the signal level of the control signal Sc reaches the upper boundary Sub. In the time interval between the time t1 and t2, the continuous signal Scs smoothly turns on the N-type field-effect transistor Mn of the band control cell 1086_n. Therefore, the PLL circuit 100 is capable of locking the frequency of the oscillating signal Sosc such that the control signal Sc smoothly changes into the voltage V1 from the upper boundary Sub as shown in FIG. 8. At time t2, the currently frequency band of the oscillating signal generator 200 is the frequency band 302n.

It should be noted that FIGS. 4-8 are just an example to illustrate the operation of the oscillating signal generator 200 when the signal level of the control signal Sc reaches the upper boundary Sub, those skill in the art are appreciated to understand the operation when the signal level of the control signal Sc reaches the lower boundary Slb. For example, when the signal level of the control signal Sc reaches the lower boundary Slb, the counter 1084a counts down the current counting number N by 1, and outputs the resulting counting number N−1 to the converting circuit 1084b. Then, the selection signal Ss_1 is changed to the low voltage level from the high voltage level. Meanwhile, the switch 1089_1 is arranged to couple the selection signal Ss_1 to the converting circuit 1088a and the selection switch 1090 is arranged to couple the continuous signal Scs to the band control cell 1086_1, in which the continuous signal Scs smoothly changes to the low voltage level from the high voltage level to slowly turn off the N-type field-effect transistor Mn of the band control cell 1086_1. Then, the frequency band of the controllable oscillator 106 is changed to the frequency band 302_m to the frequency band 302_1. The detailed description is omitted here for brevity.

According to the above description, the control circuit 108 is arranged to make the band switching speed much slower than the bandwidth of the PLL circuit 100 such that the PLL circuit 100 is able to track the frequency of the oscillating signal Sosc during the switching process. Therefore, if the loop comprised of the phase detector 102, the low-pass filter 104, the controllable oscillator 106, and the feedback circuit 112 has a first loop gain and a first loop bandwidth, and if the loop comprised of the phase detector 102, the low-pass filter 104, the control circuit 108, the current mirror 110, the controllable oscillator 106, and the feedback circuit 112 has a second loop gain and a second loop bandwidth, then the second loop gain should be larger than the first loop gain, and the second loop bandwidth should be smaller than the first loop bandwidth.

Moreover, the noise induced from the band switching will be high pass filtered by the loop of the PLL circuit 100 to a negligible order. In addition, the slope of the continuous signal Scs can be adjusted by varying the control period of the converting circuit 1088a and the pole of the low-pass filter 1088b.

In view of the above description, the PLL circuit 100 is designed to switch band slowly and continuously such that the PLL circuit 100 can track and lock the frequency of the oscillating signal Sosc during the switching process. Therefore, the plurality of frequency bands 302_1-302_x are usable for the PLL circuit 100 in real time such that the PLL circuit 100 is capable of outputting the oscillating signal Sosc with wide frequency range. As the plurality of frequency bands 302_1-302_x are usable for the PLL circuit 100 in real time, the KVCOs of the plurality of frequency bands 302_1-302_x can be designed to have small values.

Moreover, it is noted that every time the controllable oscillator 106 switches the frequency band, there is only one switch (i.e. one of the band control cells 1086_1-1086_n) needs to be smooth transition, and the other switches are kept on their current state, thus only one slew limit circuit (i.e. the slew-rate limiting circuit 1088) is used to perform the smooth transition. Therefore, the present PLL circuit 100 does not occupy large area in the chip.

Figure 9:
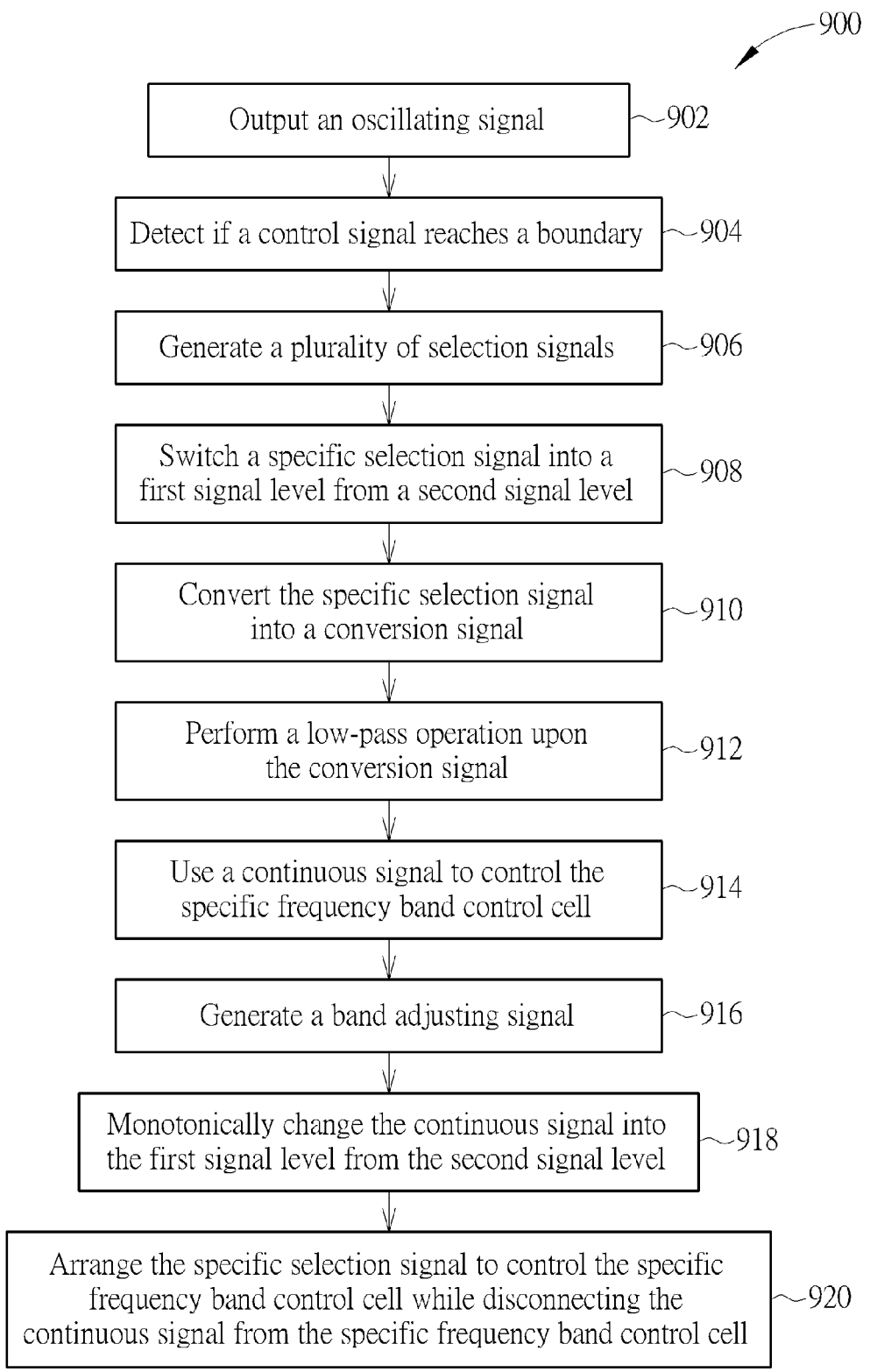
FIG. 9 is a flowchart illustrating a control method for a controllable oscillator according to an embodiment of the present invention.

Briefly, the control of the controllable oscillator 106 in the PLL circuit 100 can be summarized into the following steps in FIG. 9. FIG. 9 is a flowchart illustrating a control method 900 for the controllable oscillator 106 according to an embodiment of the present invention. Provided that substantially the same result is achieved, the steps of the flowchart shown in FIG. 9 need not be in the exact order shown and need not be contiguous; that is, other steps can be intermediate. The control method 900 comprises:

Step 902: Use the controllable oscillator to output the oscillating signal Sosc according to the control signal Sc and the band adjusting signal Sba;

Step 904: Detect if the control signal Sc reaches the boundary for generating the detection result;

Step 906: Generate the plurality of selection signals Ss_1-Ss_x according to the detection result;

Step 908: Switch the specific selection signal into the first signal level from the second signal level;

Step 910: Convert the specific selection signal into the conversion signal Scon;

Step 912: Perform the low-pass operation upon the conversion signal Scon to generate the continuous signal Scs;

Step 914: Use the continuous signal Scs to control the specific frequency band control cell of the plurality of band control cells 1086_1-1086_x to generate the specific adjusting signal of the plurality of adjusting signals Sad_1-Sad_x according to the specific selection signal of the plurality of selection signals Ss_1-Ss_x;

Step 916: Generate the band adjusting signal Sba according to the plurality of adjusting signals Sad_1-Sad_x including the specific adjusting signal;

Step 918: Monotonically change the continuous signal Scs into the first signal level from the second signal level;

Step 920: Arrange the specific selection signal to control the specific frequency band control cell while disconnecting the continuous signal Scs from the specific frequency band control cell when the continuous signal Scs reaches the first signal level.

In step 908, the specific selection signal may change to the high voltage level from the low voltage level or change to the low voltage level from the high voltage level depending on the detection result. More specifically, if the detection result indicates the control signal Sc reaches the upper boundary Sub, then the specific selection signal changes to the high voltage level from the low voltage level; and if the detection result indicates the control signal Sc reaches the lower boundary Slb, then the specific selection signal changes to the low voltage level from the high voltage level. Similarly, the continuous signal Scs is controlled to monotonically change into the high voltage level from the low voltage level to smoothly turn on the specific frequency band control cell when the detection result indicates the control signal Sc reaches the upper boundary Sub, or to monotonically change into the low voltage level from the high voltage level to smoothly turn off the specific frequency band control cell when the detection result indicates the control signal Sc reaches the lower boundary Slb.

In summary, the above embodiments are designed to switch frequency band of a PLL circuit slowly and continuously such that the PLL circuit can track and lock the frequency of the output oscillating signal during the switching process. Therefore, the plurality of frequency bands are usable for the PLL circuit in real time. Moreover, by using the above embodiments, there is only one of the band control cells needs to be smooth transition during the switching of the frequency band, thus the present PLL circuit does not occupy large area in the chip while having a low KVCO and larger tuning range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillating signal generator, comprising:
a controllable oscillator, arranged to receive a control signal, and output an oscillating signal according to the control signal and a band adjusting signal;
a control circuit, arranged to generate a continuous signal having a nonzero specific slew-rate when the control signal reaches a boundary of a control signal interval; and
a current mirror, arranged to generate the band adjusting signal, wherein when the control signal reaches the boundary of the control signal interval, the current mirror generates the band adjusting signal according to at least the continuous signal; and when the continuous signal reaches a specific signal level, the current mirror generates the band adjusting signal regardless of the continuous signal.

2. The oscillating signal generator of claim 1, wherein the controllable oscillator is a current controlled oscillator or a voltage controlled oscillator.

3. The oscillating signal generator of claim 1, wherein the continuous signal is a ramp signal.

4. The clock generator of claim 1, wherein the control circuit comprises:
a detecting circuit, arranged to detect when the control signal reaches the boundary for generating a detection result;
a band selection circuit, arranged to generate a plurality of selection signals according to the detection result;
a plurality of band control cells, arranged to selectively provide a plurality of adjusting signals according to the plurality of selection signals, respectively; and
a slew-rate limiting circuit, arranged to generate the continuous signal to control a specific frequency band control cell of the plurality of band control cells to generate a specific adjusting signal of the plurality of adjusting signals according to a specific selection signal of the plurality of selection signals;
wherein the current mirror generates the band adjusting signal according to the plurality of adjusting signals including the specific adjusting signal.

5. The oscillating signal generator of claim 4, wherein the plurality of selection signals are a plurality of digital signals, respectively.

6. The oscillating signal generator of claim 4, wherein each of the band control cells comprises:
a field-effect transistor, having a gate terminal selectively coupled to one of the plurality of selection signals or the continuous signal and a drain terminal selectively outputted one of the plurality of adjusting signals; and
a resistor, having a first terminal coupled to a source terminal of the field-effect transistor, and a second terminal coupled to a reference voltage.

7. The oscillating signal generator of claim 4, wherein the detecting circuit comprises:
a first comparator, arranged to compare the control signal with an upper boundary, and to output a first comparison signal as the detection result when the control signal reaches the upper boundary; and
a second comparator, arranged to compare the control signal with a lower boundary, and to output a second comparison signal as the detection result when the control signal reaches the lower boundary;
wherein the control signal interval is the interval between the upper boundary and the lower boundary.

8. The oscillating signal generator of claim 7, wherein the band selection circuit comprises:
a counter, arranged to generate a counting number according to the first comparison signal and the second comparison signal;
a first converting circuit, arranged to convert the counting number into the plurality of selection signals;
wherein the counting number indicates a current frequency band being selected by the controllable oscillator.

9. The oscillating signal generator of claim 4, wherein when the control signal reaches the boundary, the band selection circuit is arranged to switch the specific selection signal into a first signal level from a second signal level, and the slew-rate limiting circuit comprises:
a second converting circuit, arranged to receive and convert the specific selection signal into a conversion signal; and
a low-pass filter, arranged to perform a low-pass operation upon the conversion signal to generate the continuous signal for controlling the specific frequency band control cell.

10. The oscillating signal generator of claim 9, wherein the second converting circuit is a digital-to-analog converter.

11. The oscillating signal generator of claim 9, wherein when the continuous signal reaches the first signal level, the specific frequency band control cell is arranged to be controlled by the first signal level.

12. The oscillating signal generator of claim 9, wherein the low-pass filter is arranged to monotonically change the continuous signal into the first signal level from the second signal level, and when the continuous signal reaches the first signal level, the specific selection signal is arranged to control the specific frequency band control cell while the continuous signal is disconnected from the specific frequency band control cell.

13. The oscillating signal generator of claim 9, wherein the slew-rate limiting circuit further comprises:
a plurality of switches, each arranged to couple a selection signal in the plurality of selection signals to a band control cell in the plurality of band control cells if a signal level of the selection signal is the first signal level before the control signal reaches the boundary, and when the control signal reaches the boundary, a specific switch in the plurality of switches is arranged to couple the specific selection signal to the second converting circuit; and a selection switch, coupled to the low-pass filter, for coupling the continuous signal to the specific frequency band control cell when the control signal reaches the boundary.

14. The oscillating signal generator of claim 13, wherein when the continuous signal reaches the first signal level, the specific switch is arranged to couple the specific selection signal to the specific frequency band control cell, and the selection switch is arranged to not couple the continuous signal to the specific frequency band control cell.

15. A phase-lock loop circuit, comprising:
a phase detector, arranged to generate a detection signal according to a reference signal and a feedback signal;
a low-pass filter, arranged to generate a control signal according to the detection signal;
a controllable oscillator, arranged to receive the control signal, and output an oscillating signal according to the control signal and a band adjusting signal;
a control circuit, arranged to generate a continuous signal having a nonzero specific slew-rate when the control signal reaches a boundary of a control signal interval;
a current mirror, arranged to generate the band adjusting signal, wherein when the control signal reaches the boundary of the control signal interval, the current mirror generates the band adjusting signal according to at least the continuous signal; and when the continuous signal reaches a specific signal level, the current mirror generates the band adjusting signal regardless of the continuous signal; and
a feedback circuit, arranged to generate the feedback signal according to the oscillating signal.

16. The phase-lock loop circuit of claim 15, wherein a first loop comprised of the phase detector, the low-pass filter, the controllable oscillator, and the feedback circuit has a first loop gain and a first loop bandwidth, a second loop comprised of the phase detector, the low-pass filter, the control circuit, the current mirror, the controllable oscillator, and the feedback circuit has a second loop gain and a second loop bandwidth, the second loop gain is larger than the first loop gain, and the second loop bandwidth is smaller than the first loop bandwidth.

17. A control method for controlling a controllable oscillator, comprising:
using a controllable oscillator to receive a control signal, and output an oscillating signal according to the control signal and a band adjusting signal;
generating a continuous signal having a nonzero specific slew-rate when the control signal reaches a boundary of a control signal interval;
when the control signal reaches the boundary of the control signal interval, generating the band adjusting signal according to at least the continuous signal; and
when the continuous signal reaches a specific signal level, generating the band adjusting signal regardless of the continuous signal.

18. The control method of claim 17, wherein the continuous signal is a ramp signal.

19. The control method of claim 17, wherein the step of generating the continuous signal having the specific slew-rate when the control signal reaches the boundary of the control signal interval comprises:
detecting when the control signal reaches the boundary for generating a detection result;
generating a plurality of selection signals according to the detection result;
using a plurality of band control cells to selectively provide a plurality of adjusting signals according to the plurality of selection signals, respectively; and
generating the continuous signal to control a specific frequency band control cell of the plurality of band control cells to generate a specific adjusting signal of the plurality of adjusting signals according to a specific selection signal of the plurality of selection signals;
wherein the step of generating the band adjusting signal according to at least the continuous signal comprises:
generating the band adjusting signal according to the plurality of adjusting signals including the specific adjusting signal.

20. The control method of claim 19, wherein the step of detecting when the control signal reaches the boundary for generating the detection result comprises:
comparing the control signal with an upper boundary, and outputting a first comparison signal as the detection result when the control signal reaches the upper boundary; and
comparing the control signal with a lower boundary, and outputting a second comparison signal as the detection result when the control signal reaches the lower boundary;
wherein the control signal interval is the interval between the upper boundary and the lower boundary.

21. The control method of claim 20, wherein the step of generating the plurality of selection signals according to the detection result comprises:
generating a counting number according to the first comparison signal and the second comparison signal; and
converting the counting number into the plurality of selection signals;
wherein the counting number indicates a current frequency band being selected by the controllable oscillator.

22. The control method of claim 19, wherein when the control signal reaches the boundary, the step of generating the plurality of selection signals according to the detection result further comprises:
switching the specific selection signal into a first signal level from a second signal level; and
the step of generating the continuous signal to control the specific frequency band control cell of the plurality of band control cells to generate the specific adjusting signal of the plurality of adjusting signals according to the specific selection signal of the plurality of selection signals comprises:
receiving and converting the specific selection signal into a conversion signal; and
performing a low-pass operation upon the conversion signal to generate the continuous signal for controlling the specific frequency band control cell.

23. The control method of claim 22, wherein when the continuous signal reaches the first signal level, the control method further comprises:
arranging the specific frequency band control cell to be controlled by the first signal level.

24. The control method of claim 22, wherein the step of performing the low-pass operation upon the conversion signal to generate the continuous signal for controlling the specific frequency band control cell comprises:
- monotonically changing the continuous signal into the first signal level from the second signal level;
- wherein when the continuous signal reaches the first signal level, the control method further comprises:
- arranging the specific selection signal to control the specific frequency band control cell while disconnecting the continuous signal from the specific frequency band control cell.

* * * * *